(12) United States Patent
Amada et al.

(10) Patent No.: US 7,072,164 B2
(45) Date of Patent: Jul. 4, 2006

(54) ELECTRIC PARTS DRIVE CIRCUIT

(75) Inventors: Junichi Amada, Nagano (JP); Tomoharu Tuchiya, Nagano (JP)

(73) Assignee: Nissin Kogyo Co., Ltd., Nagano-ken (JP)

( * ) Notice: Subject to any disclaimer, the term of this patent is extended or adjusted under 35 U.S.C. 154(b) by 309 days.

(21) Appl. No.: 10/705,253

(22) Filed: Nov. 12, 2003

(65) Prior Publication Data
US 2004/0136129 A1    Jul. 15, 2004

(30) Foreign Application Priority Data
Nov. 12, 2002   (JP) ............... P. 2002-328711

(51) Int. Cl.
*H01H 9/00* (2006.01)
(52) U.S. Cl. .................. 361/160; 361/139; 361/152
(58) Field of Classification Search ............. 361/160
See application file for complete search history.

(56) References Cited

U.S. PATENT DOCUMENTS 5,625,518 A * 4/1997 Bober ...................... 361/56

6,493,204 B1 * 12/2002 Glidden et al. ............. 361/187

FOREIGN PATENT DOCUMENTS

JP        11-205114       7/1999
WO      WO 01/03987 A1   1/2001

\* cited by examiner

*Primary Examiner*—Phuong T. Vu
*Assistant Examiner*—Terrence Willoughby
(74) *Attorney, Agent, or Firm*—Greenblum & Bernstein, P.L.C.

(57) ABSTRACT

An electric parts drive circuit has: a first field-effect transistor including in parallel a first parasitic diode and provided between the plus line and an electric part; a second field-effect transistor including in parallel a second parasitic diode, the first and second field-effect transistors being connected in series in order from the plus line to the electric part; a third field-effect transistor including in parallel a third parasitic diode and provided between a minus line and the electric part; a failure diagnosis switch unit; and a switch control unit, wherein the switch control unit diagnoses a failure of the second field-effect transistor based on the voltage between the first and second field-effect transistors responsive to switching between conduction and shutoff of the second field-effect transistor in a state that the first and third field-effect transistors are shut off and the failure diagnosis switch unit is brought into conduction.

7 Claims, 3 Drawing Sheets

ELECTRIC PARTS DRIVE CIRCUIT

BACKGROUND OF THE INVENTION

1. Field of the Invention

The present invention relates to a drive circuit of an electric part such as a solenoid, for example, and in particular to an improvement in an electric parts drive circuit wherein between a plus line to be connected to the plus terminal of a battery and an electric part, a first field-effect transistor including in parallel a first parasitic diode for allowing an electric current flow into the plus line and a second field-effect transistor for reverse connection protection including in parallel a second parasitic diode for allowing an electric current flow from the first field-effect transistor into the electric part are connected in series in order from the plus line to the electric part and a third field-effect transistor including in parallel a third parasitic diode for allowing an electric current flow into the electric part is provided between a minus line to be connected to the minus terminal of the battery and the electric part.

2. Description of the Related Art

For example, in a drive circuit for driving an electromagnetic valve used with a brake fluid pressure controller for a vehicle in a related art, a field-effect transistor 5 for fail safe, a solenoid 1 of the electromagnetic valve, and a field-effect transistor 9 for switching the solenoid 1 between energization and shutoff are connected between both terminals of a battery 2, as shown in FIG. 3. However, a parasitic diode 6, 10 for blocking an electric current flow from the plus terminal of the battery 2 is connected in parallel with the field-effect transistor 5, 9. Thus, with the circuit configuration intact, at the reverse connection time of the battery 2, an undesirable electric current flows into the solenoid 1 and the electromagnetic valve erroneously operates. Then, it is a common practice to place a field-effect transistor 7 for reverse connection protection including in parallel a parasitic diode 8 for allowing an electric current flow from the plus terminal of the battery 2 to the solenoid 1 between the field-effect transistor 5 for fail safe and the solenoid 1.

By the way, the field-effect transistor 7 for reverse connection protection also has the possibility of a failure. Although the failure is to be detected, if the field-effect transistor 7 fails in the on state, an electric current flows through the failing field-effect transistor 7 into the solenoid 1; if the field-effect transistor 7 fails in the off state, an electric current flows through the parasitic diode 8 into the solenoid 1. Thus, in the electric parts drive circuit in the related art, it is difficult to diagnose the failure of the field-effect transistor 7 for reverse connection protection.

SUMMARY OF THE INVENTION

It is therefore an object of the present invention to provide an electric parts drive circuit for making it possible to diagnose a failure of a field-effect transistor for reverse connection protection regardless of whether the field-effect transistor is on or off.

To the end, according to a first aspect of the present invention, there is provided an electric parts drive circuit having: a first field-effect transistor including in parallel a first parasitic diode for allowing an electric current flow into a plus line and provided between the plus line to be connected to a plus terminal of a battery and an electric part; a second field-effect transistor for reverse connection protection including in parallel a second parasitic diode for allowing an electric current flow from the first field-effect transistor into the electric part, the first field-effect transistor and the second field-effect transistor being connected in series in order from the plus line to the electric part; a third field-effect transistor including in parallel a third parasitic diode for allowing an electric current flow into the electric part and provided between a minus line to be connected to a minus terminal of the battery and the electric part; a failure diagnosis switch unit for switching between conduction and shutoff between a drain of the second field-effect transistor and the plus terminal of the battery; and a switch control unit for controlling switching between conduction and shutoff of the first to third field-effect transistors and the failure diagnosis switch unit, wherein the switch control unit diagnoses a failure of the second field-effect transistor based on the voltage between the first and second field-effect transistors responsive to switching between conduction and shutoff of the second field-effect transistor in a state that the first and third field-effect transistors are shut off and the failure diagnosis switch unit is brought into conduction.

According to a second aspect of the present invention, there is provided the electric parts drive circuit as set forth in the first aspect, wherein the failure diagnosis switch unit includes: a PNP transistor having a connector connected via a resistor between the plus terminal of the battery and the drain of the second field-effect transistor; second resistors and an NPN transistor connected in series between the plus terminal of the battery and ground; and third resistors connected in series between the switch control unit and ground, wherein the connection point of the second resistors is connected to the base of the PNP transistor and the connection point of the third resistors is connected to the base of the NPN transistor.

According to a third aspect of the present invention, there is provided the electric parts drive circuit as set forth in the first aspect, wherein the electric part is a solenoid in an electromagnetic valve of a brake fluid pressure controller for a vehicle.

According to the configuration, when the failure diagnosis switch unit is brought into conduction with the first and third field-effect transistors shut off for making is possible to supply electric power from the battery to the drain of the second field-effect transistor, if the second field-effect transistor is off and fails, even if the switch control unit outputs a signal for switching the second field-effect transistor between conduction and shutoff, the voltage between the first and second field-effect transistors remains low. If the second field-effect transistor is on and fails, even if the switch control unit outputs a signal for switching the second field-effect transistor between conduction and shutoff, the voltage between the first and second field-effect transistors remains high. Therefore, if the second field-effect transistor for reverse connection protection fails regardless of the on or off state, the failure of the second field-effect transistor can be diagnosed.

DETAILED DESCRIPTION OF THE PREFERRED EMBODIMENTS

Referring now to the accompanying drawings, there is shown a preferred embodiment of the present invention.

Figure 1:
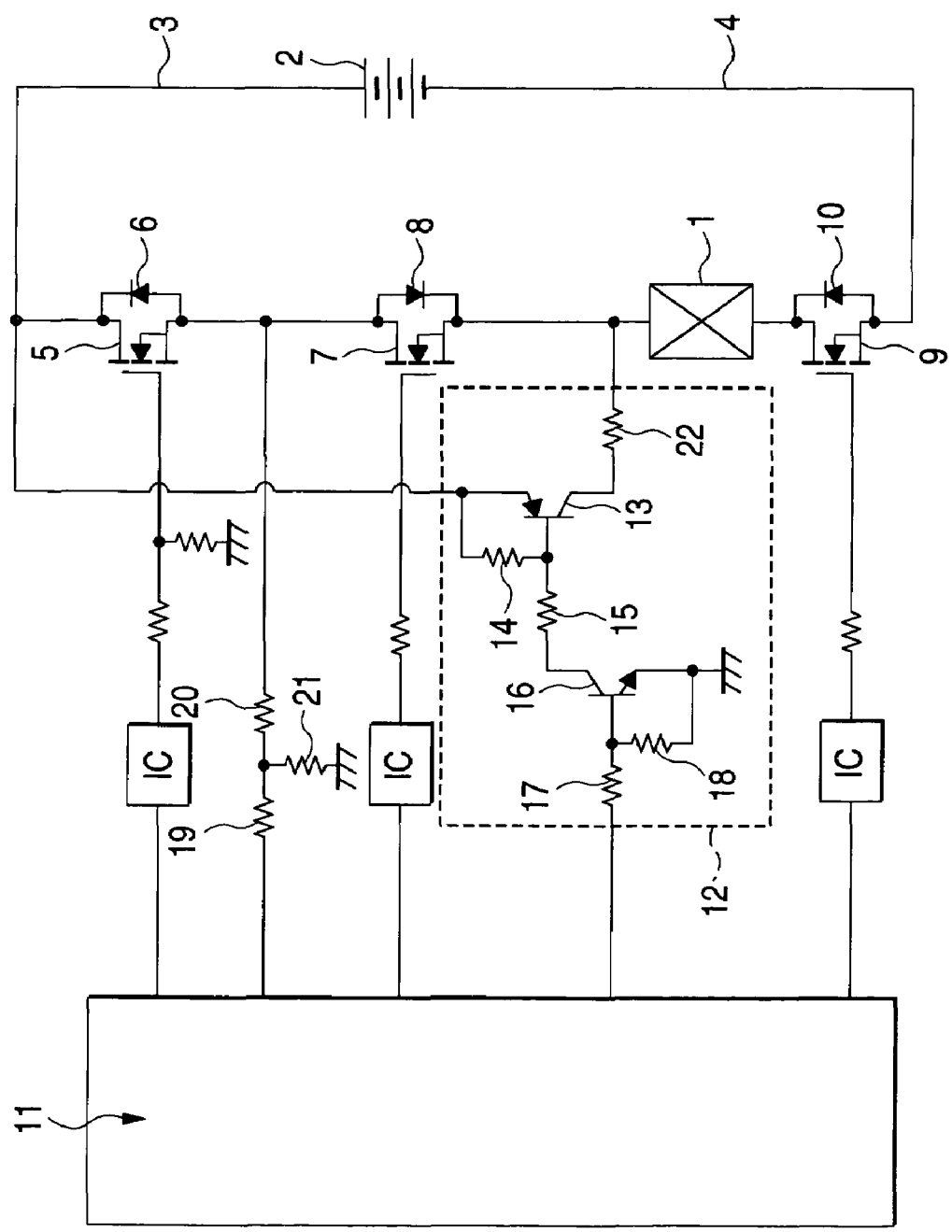
FIG. 1 is a diagram to show the configuration of an electric parts drive circuit.
Figure 2:
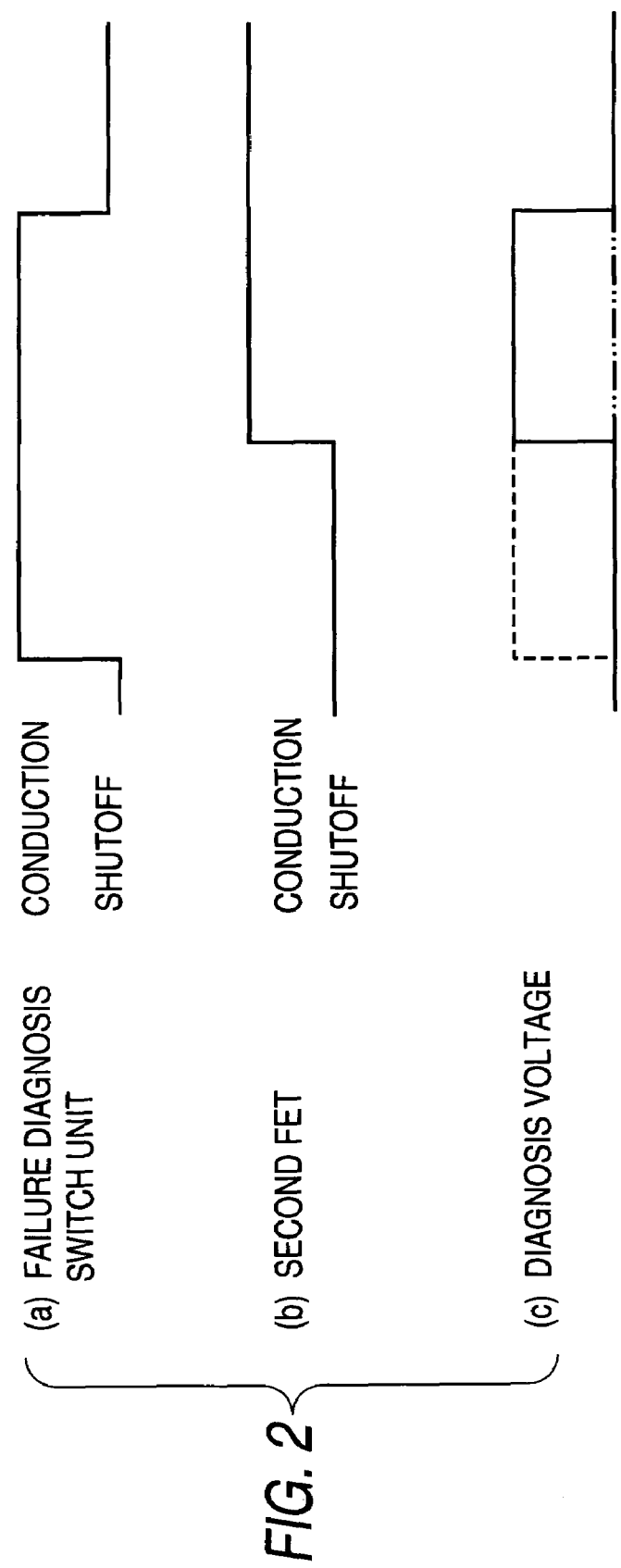
FIG. 2 is a timing chart at the failure diagnosis time.
Figure 3:
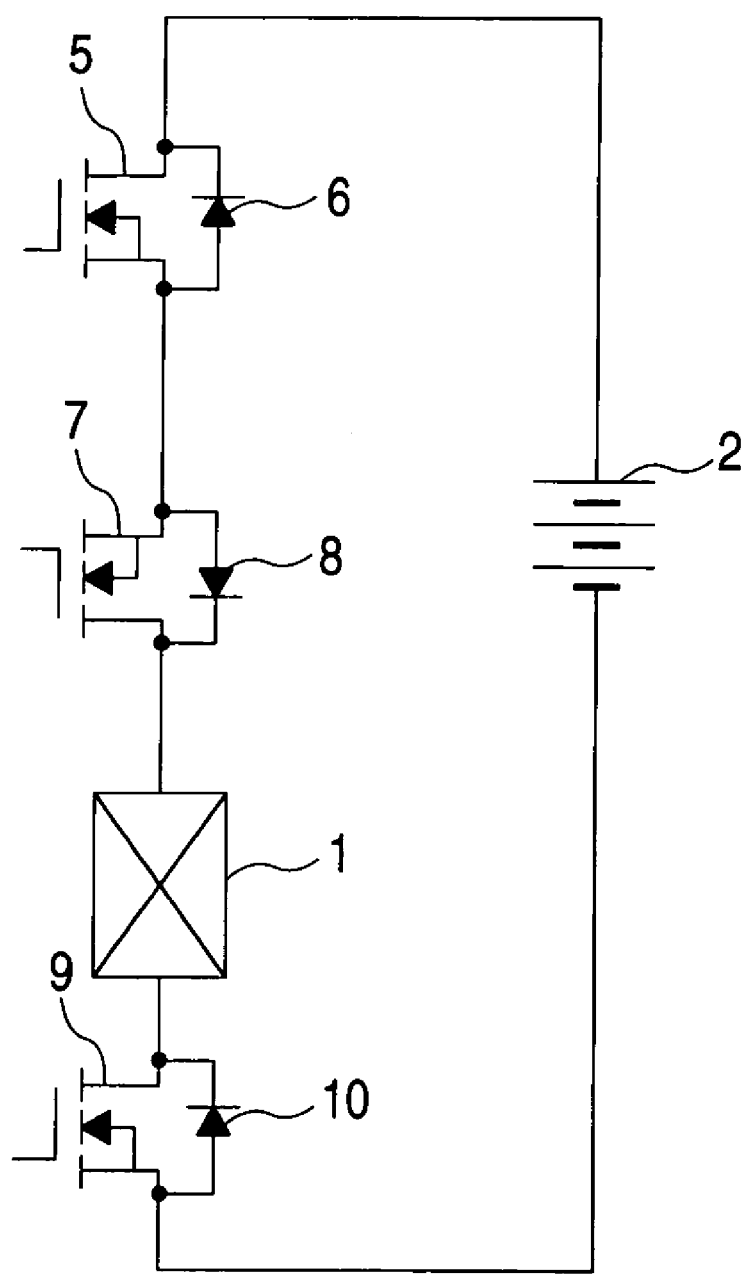
FIG. 3 is a diagram to show the configuration of an electric parts drive circuit in a related art.

FIGS. 1 and 2 show one embodiment of the present invention; FIG. 1 is a diagram to show the configuration of an electric parts drive circuit and FIG. 2 is a timing chart at the failure diagnosis time.

To begin with, in FIG. 1, a solenoid 1 as an electric part is included in an electromagnetic valve of a brake fluid pressure controller for a vehicle, for example. Between a plus line 3 to be connected to the plus terminal of a battery 2 installed in a vehicle and the solenoid 1, a first field-effect transistor 5 for fail safe and a second field-effect transistor 7 for reverse connection protection are connected in series in order from the plus line 3 to the solenoid 1. The first field-effect transistor 5 includes in parallel a first parasitic diode 6 for allowing an electric current flow from the second field-effect transistor 7 for reverse connection protection into the plus line 3, and the second field-effect transistor 7 for reverse connection protection includes in parallel a second parasitic diode 8 for allowing an electric current flow from the first field-effect transistor 5 into the solenoid 1.

A third field-effect transistor 9 for switching the solenoid 1 between energization and shutoff is provided between a minus line 4 to be connected to the minus terminal of the battery 2 and the solenoid 1 and includes in parallel a third parasitic diode 10 for allowing an electric current flow from the minus line 4 into the solenoid 1.

Conduction and shutoff of the first field-effect transistor 5, the second field-effect transistor 7 for reverse connection protection, and the third field-effect transistor 9 are controlled by switch control unit 11, and a control voltage for switching between conduction and shutoff is input from the switch control unit 11 to the gate of the field-effect transistor 5, 7, 9.

In such a solenoid drive circuit, if the battery 2 is reversely connected by mistake in such a manner that the minus terminal of the battery 2 is connected to the plus line 3, assuming that the second field-effect transistor 7 for reverse connection protection does not exist, the electric current from the battery 2 flows from the minus line 4 through the third parasitic diode 10, the solenoid 1, and the first parasitic diode 6 into the plus line 3 and thus the electromagnetic valve erroneously operates as the solenoid 1 is energized. However, since the second field-effect transistor 7 for reverse connection protection includes in parallel the second parasitic diode 8 for allowing the electric current flow from the first field-effect transistor 5 into the solenoid 1 is provided between the first field-effect transistor 5 and the solenoid 1, if the battery 2 is reversely connected by mistake, energizing of the solenoid is prevented in the presence of the second parasitic diode 8.

To diagnose a failure of the second field-effect transistor 7, failure diagnosis switch unit 12 is provided between the drain of the second field-effect transistor 7 and the plus terminal of the battery 2. The failure diagnosis switch unit 12 includes a PNP transistor 13 having a collector connected via a (first) resistor 22 between the plus terminal of the battery 2 and the drain of the second field-effect transistor 7, (second) resistors 14 and 15 and an NPN transistor 16 connected in series between the plus terminal of the battery 2 and ground, and (third) resistors 17 and 18 connected in series between the switch control unit 11 and ground. The connection point of the resistors 14 and 15 is connected to the base of the PNP transistor 13 and the connection point of the resistors 17 and 18 is connected to the base of the NPN transistor 16.

In the failure diagnosis switch unit 12, as a high control signal is input from the switch control unit 11 to the base of the NPN transistor 16, the NPN transistor 16 is brought into conduction and accordingly the PNP transistor 13 is brought into conduction.

The switch control unit 11 has a function of diagnosing a failure of the second field-effect transistor 7 based on the voltage between the first and second field-effect transistors 5 and 7 and is connected via registers 19 and 20 connected in series between the first and second field-effect transistors 5 and 7. Both the registers 19 and 20 are grounded via a resistor 21.

To diagnose a failure of the second field-effect transistor 7, the switch control unit 11 shuts off the first and third field-effect transistors 5 and 9 and brings the failure diagnosis switch unit 12 into conduction and in this state, switches the second field-effect transistor 7 between conduction and shutoff.

Here, if the second field-effect transistor 7 is switched between conduction and shutoff as shown in (b) of FIG. 2 with the failure diagnosis switch unit 12 brought into conduction as shown in (a) of FIG. 2, when the second field-effect transistor 7 is normal, the diagnosis voltage between the first and second field-effect transistors 5 and 7 goes low at the shutoff time of the second field-effect transistor 7 and goes high at the conduction time as indicated by the solid line in (c) of FIG. 2.

In contrast, when the second field-effect transistor 7 is off and fails, if the switch control unit 11 outputs a control signal for switching the second field-effect transistor 7 between conduction and shutoff, the diagnosis voltage between the first and second field-effect transistors 5 and 7 remains low as indicated by the dot and dash line in (c) of FIG. 2. When the second field-effect transistor 7 is on and fails, if the switch control unit 11 outputs a control signal for switching the second field-effect transistor 7 between conduction and shutoff, the diagnosis voltage between the first and second field-effect transistors 5 and 7 remains high as indicated by the dotted line in (c) of FIG. 2.

Thus, the diagnosis voltage between the first and second field-effect transistors 5 and 7 differs at the normal time of the second field-effect transistor 7, at the failure time of the second field-effect transistor 7 in the off state, and at the failure time of the second field-effect transistor 7 in the on state, so that if the second field-effect transistor 7 for reverse connection protection fails regardless of the on or off state, the switch control unit 11 can diagnose the failure of the second field-effect transistor 7.

Although the embodiment of the present invention has been described, it is to be understood that the present invention is not limited to the described embodiment and the combination and arrangement of parts may be resorted to without departing from the spirit and the scope of the present invention as claimed.

As described above, according to the present invention, if the second field-effect transistor 7 for reverse connection protection fails regardless of the on or off state, the failure of the second field-effect transistor 7 can be diagnosed.

What is claimed is:

1. An electric parts drive circuit comprising:
a first field-effect transistor including in parallel a first parasitic diode for allowing an electric current flow into a plus line and provided between the plus line to be connected to a plus terminal of a battery and an electric part;
a second field-effect transistor for reverse connection protection including in parallel a second parasitic diode for allowing an electric current flow from the first field-effect transistor into the electric part, the first field-effect transistor and the second field-effect transistor being connected in series in order from the plus line to the electric part;
a third field-effect transistor including in parallel a third parasitic diode for allowing an electric current flow into the electric part and provided between a minus line to be connected to a minus terminal of the battery and the electric part;
a failure diagnosis switch unit for switching between conduction and shutoff between a drain of the second field-effect transistor and the plus terminal of the battery; and
a switch control unit for controlling switching between conduction and shutoff of the first to third field-effect transistors and the failure diagnosis switch unit,
wherein the switch control unit diagnoses a failure of the second field-effect transistor based on the voltage between the first and second field-effect transistors responsive to switching between conduction and shutoff of the second field-effect transistor in a state that the first and third field-effect transistors are shut off and the failure diagnosis switch unit is brought into conduction,
wherein the failure diagnosis switch unit includes:
a PNP transistor having a collector connected via a first resistor between the plus terminal of the battery and the drain of the second field-effect transistor;
second resistors and an NPN transistor connected in series between the plus terminal of the battery and ground; and
third resistors connected in series between the switch control unit and ground,
wherein a connection point of the second resistors is connected to a base of the PNP transistor and a connection point of the third resistors is connected to a base of the NPN transistor.

2. The electric parts drive circuit as set forth in claim 1, wherein the electric part is a solenoid in an electromagnetic valve of a brake fluid pressure controller for a vehicle.

3. An electric parts drive circuit, comprising:
a first field-effect transistor including in parallel a first parasitic diode;
a second field-effect transistor for reverse connection protection including in parallel a second parasitic diode;
a third field-effect transistor including in parallel a third parasitic diode;
wherein the first field-effect transistor, the second field-effect transistor, an electric part, and the third field effect-transistor are connected in series between a plus terminal and a minus terminal of a battery;
a failure diagnosis switch unit between a drain of the second field-effect transistor and the plus terminal of the battery; and
a switch control unit for controlling switching between conduction and shutoff of the first field-effect transistor, the second field-effect transistor, the third field effect-transistor, and the failure diagnosis switch unit,
wherein the switch control unit diagnoses a failure of the second field-effect transistor.

4. The electric parts drive circuit as set forth in claim 3, wherein the failure diagnosis switch unit includes:
a PNP transistor having a collector connected via a first resistor between the plus terminal of the battery and the drain of the second field-effect transistor;
second resistors and an NPN transistor connected in series between the plus terminal of the battery and ground; and
third resistors connected in series between the switch control unit and ground,
wherein a connection point of the second resistors is connected to a base of the PNP transistor and a connection point of the third resistors is connected to a base of the NPN transistor.

5. The electric parts drive circuit as set forth in claim 3, wherein the electric part is a solenoid in an electromagnetic valve of a brake fluid pressure controller for a vehicle.

6. The electric parts drive circuit as set forth in claim 3, wherein the switch control unit diagnoses a failure of the second field-effect transistor based on a voltage between the first and second field-effect transistors.

7. The electric parts drive circuit as set forth in claim 3, wherein to diagnose a failure of the second field-effect transistor, the switch control unit shuts off the first and third field-effect transistors and brings the failure diagnosis switch unit into conduction, and switches the second field-effect transistor between conduction and shutoff.

* * * * *